United States Patent [19]

Hunt

[11] 4,074,195
[45] Feb. 14, 1978

[54] SEMICONDUCTOR TESTER

[76] Inventor: Bill Hunt, 6408-139th SE, Snohomish, Wash. 98290

[21] Appl. No.: 769,110

[22] Filed: Feb. 16, 1977

[51] Int. Cl.² .............................................. G01R 31/22
[52] U.S. Cl. ............................... 324/158 D; 324/60 C; 324/158 T
[58] Field of Search ............. 324/158 D, 158 T, 60 C, 324/73 R

[56]  References Cited
U.S. PATENT DOCUMENTS 3,973,198   8/1976   Hunt ................................ 324/158 D

OTHER PUBLICATIONS

Grant, H. C., "Zener Diode Presenter...", Semiconductor Products; Jan. 1962; pp. 34-37.

Primary Examiner—Rudolph V. Rolinec
Assistant Examiner—Ernest F. Karlsen

[57] ABSTRACT

An apparatus for testing the operating state of single and multiple semiconductor junctions, either in or out of circuit. The tester includes a testing circuit which in turn includes a transformer having a secondary with plurality of voltage tap leads, which are selectively connectable by a switching device to a resistance and voltage divider array, which includes means adapted to receive the junction to be tested. The output of the testing circuit is applied to a display circuit which includes a visual indicator, which in turn produces a trace having a configuration representative of the forward and reverse characteristics of the junction, for inspection by an operator. The variety of voltages available at the secondary of the transformer and the variety of resistance and voltage divider combinations available permit the safe testing of a wide variety of junctions, including multiple junctions.

15 Claims, 6 Drawing Figures

SEMICONDUCTOR TESTER

BACKGROUND OF THE INVENTION

The present invention relates generally to the electronic test apparatus art, and more particularly is concerned with the testing of single and multiple semiconductor junctions for the purpose of determining their operating condition.

The semiconductor tester disclosed and claimed in U.S. Pat. No. 3,973,198, titled "In-Circuit Semiconductor Tester" and having the same inventor as that of the present application, was a significant advance in the art at the time of its invention, because it was capable of accurately and completely testing a single semiconductor junction while the junction was still connected in circuit, even low impedance circuits. The apparatus of the '198 patent, the subject matter of which is hereby incorporated by reference, has been found experimentally to operate very well and has fulfilled the expectations of its inventor. The apparatus has been found to have some operating limitations, however. For instance, in some circumstances, it is desirable to test multiple junctions, such as from emitter to collector of a single transistor, or to test cascaded junctions. The U.S. Pat. No. 3,973,198 apparatus is not capable of completely testing multiple or cascaded junctions due to their relatively high AC impedance. The visual patterns produced in such a situation are often difficult to interpret, and may in some cases be misleading.

Additionally, certain types of transistors, such as power transistors, as well as multiple and cascaded junctions, require a higher firing voltage than is currently available in the U.S. Pat. No. 3,973,198 apparatus, and hence the junctions in those transistors cannot be tested.

Further, it has been found that the U.S. Pat. No. 3,973,198 apparatus is in operation often difficult to match with available oscilloscopes, leading to an impairment in usefulness of the tester because of the increased difficulty in interpreting the resulting visual patterns or trace. In some cases, due to insufficient horizontal gain, a particular oscilloscope cannot even be used. Furthermore, the use of an oscilloscope with the U.S. Pat. No. 3,973,198 apparatus has proven to be an inefficient use of the scope, and the U.S. Pat. No. 3,973,198 apparatus hence sometimes is not used in situations where it might otherwise be beneficial.

Accordingly, it is a general object of the present invention to provide an improved semiconductor tester which overcomes the disadvantages of the prior art noted above.

It is another object of the present invention to provide such a tester which is capable of accurately determining the operating condition of both single and multiple semiconductor junctions.

It is an additional object of the present invention to provide such as tester which is capable of accurately and completely testing single and multiple semiconductor junctions without harming either the junctions or the circuits in which they are connected.

It is a further object of the present invention to provide such a tester which is capable of testing semiconductor junctions both in and out of circuit.

It is an additional object of the present invention to provide such a tester which is capable of simultaneously showing the forward and reverse characteristics of the junction or junctions under test.

It is yet another object of the present invention to provide such a tester which is capable of providing a sufficient magnitude of voltage to fire substantially all semiconductor junctions, as well as multiple junctions, at a limited current level which is sufficiently low to prevent harm to the semiconductor.

It is a further object of the present invention to provide such a tester which includes an oscilloscope and a testing circuit in a single, portable apparatus.

It is an additional object of the present invention to provide such a tester which includes a testing circuit producing output signals which have a preselected voltage level adapted for use in the integral oscilloscope.

SUMMARY OF THE INVENTION

The present invention includes a visual indicator having two input connections, and an AC signal generator having first, second and third output leads, with the signal generator providing in operation a known voltage between the first and third output means, and a known but variable voltage between the first and second output leads. A first impedance is connected between the first output lead and ground. Probes are provided to receive the junction to be tested, the probes being connected such that the junction is in parallel electrically with the first impedance, such that an AC signal is provided in operation across the tester. A second impedance is connectable between the second output lead and ground, wherein the second impedance, when so connected, is in parallel electrically with the first impedance. A third impedance is connectable between the third output lead and ground, wherein the third impedance, when so connected, is in parallel electrically with the first impedance, the third impedance having a value which is substantially lower than the effective impedance of the circuit in which the junction is connected. Means are connected to said third impedance means for selectively connecting and disconnecting the third impedance from the third output lead. In operation of the tester, a first signal is developed between the first impedance and ground for application to the horizontal input of the indicator means and a second signal is developed between the second impedance means and ground for application to the vertical input of the indicator means. The signal generating means is so configured and arranged and the second impedance has such a value that (1) in a first tester mode, wherein the third impedance is connected and the AC voltage between the first and third voltage leads is greater than that between the first and second voltage leads, an impedance is presented to the junction which is substantially lower than the effective impedance of the circuit in which the junction is connected, and (2) in a second tester mode, wherein said third impedance means is disconnected, sufficient impedance is presented to the junction to limit the current therethrough to a level which is safe for the junction.

DESCRIPTION OF THE DRAWINGS

A more thorough understanding of the invention may be obtained by a study of the following detailed description taken in connection with the accompanying drawings in which.

DESCRIPTION OF THE PREFERRED EMBODIMENT

Figure 1:
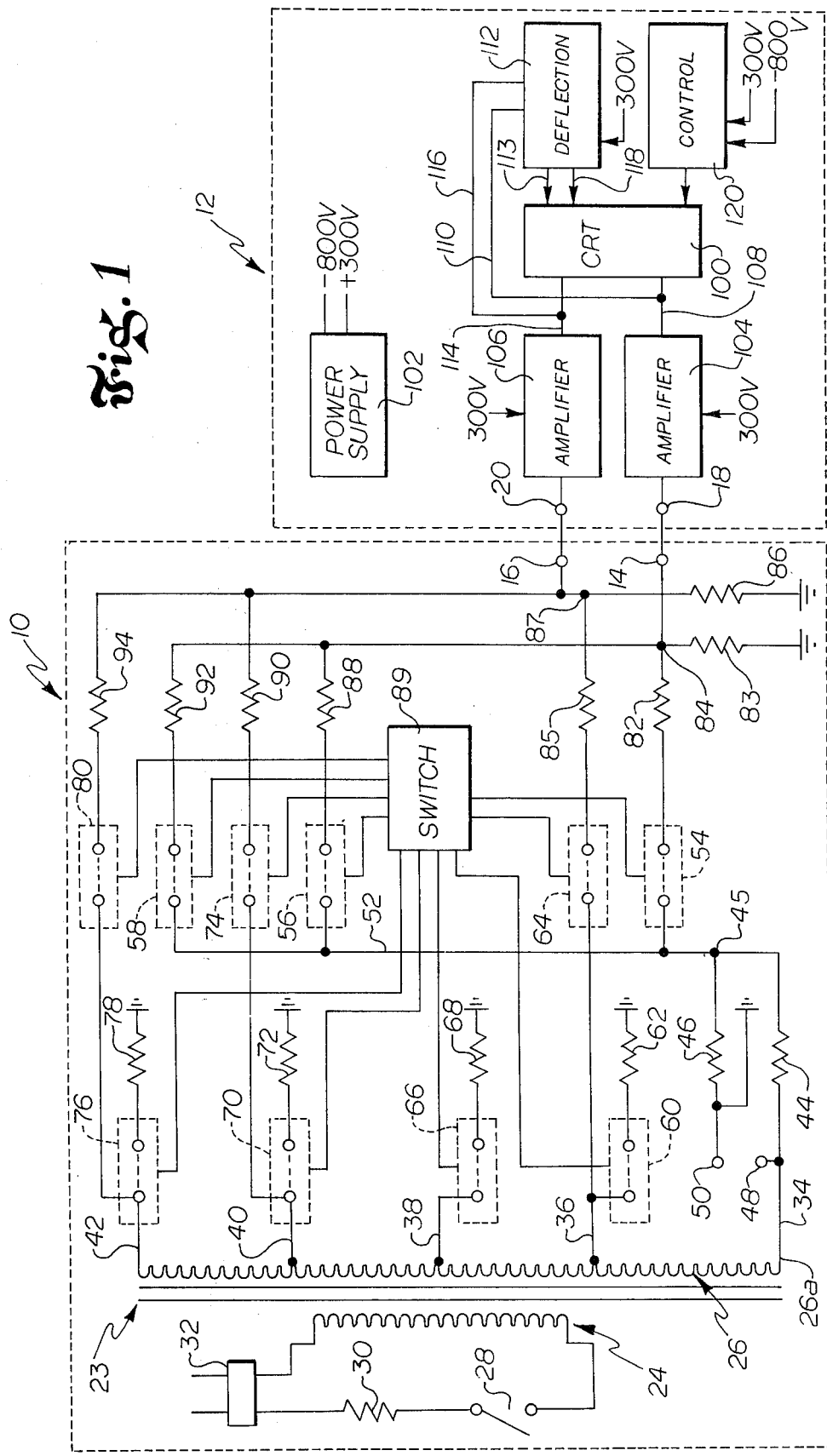
FIG. 1 is a combined schematic and block diagram showing the testing circuit and the display circuit of the present invention.

Referring to FIG. 1, the present invention comprises a testing circuit shown generally at 10, and a display circuit shown generally at 12. When a semiconductor junction or junctions are connected in testing circuit 10 and the tester is activated, so that an AC voltage is presented across the junction, testing circuit 10 produces signal outputs at horizontal and vertical output points 14 and 16. The signal outputs are applied, respectively, to horizontal and vertical inputs 18 and 20 of display circuit 12.

The signals present at horizontal and vertical inputs 18 and 20 produce a pattern or trace on a visual display device, such as a cathode ray tube which forms a part of display circuit 12. The configuration of the trace, which is easily interpretable by an operator, is indicative of both the forward and reverse characteristics of the semiconductor junction or junctions under test.

The apparatus of FIG. 1 is designed to determine the operating state of a wide variety of semiconductor junctions, both in and out of circuit. To accomplish this, testing circuit 10, in the embodiment shown, operates in three different modes or ranges. In one mode, a low voltage, very low impedance is presented to the junction under test. In the second and third modes, medium and high voltages and impedances, respectively, are presented, for testing multiple junctions or high voltage junctions at very low current.

Testing circuit 10, in the embodiment shown, includes a transformer, shown generally at 23, having a primary winding 24 and a secondary winding 26. Primary winding 24 includes an on-off switch 28 and a resistance 30, which in the embodiment shown is 6 Kohms and which functions to help limit the current in secondary winding 26. Primary winding 24 also includes a conventional plug 32 for insertion into a 110 volt, 60 cycle source, such as a conventional wall socket.

Secondary winding 26 includes a common secondary lead 34 connected at the lower end 26a of secondary winding 26, and further includes first, second, third and fourth secondary leads 36, 38, 40 and 42, respectively. Fourth secondary lead 42 is connected to the upper end 26b of secondary winding 26, and first, second and third secondary leads 36, 38 and 40 are connected to secondary winding 26 at successive tap points therealong.

Common secondary lead 34 is connected to one end of a first voltage divider, comprising resistances 44 and 46, the other end of which is connected to ground. Signal probes represented at 48 and 50 are secured to the opposite ends of the first voltage divider and are adapted to be placed across the junction or junctions to be tested.

A circuit line 52 extends from a circuit connection point 45 between resistances 44 and 46, and includes three selectable connections 54, 56 and 58 therealong, one connection for each operating mode of testing circuit 10. Connections 54, 56 and 58 permit coupling of circuit connection point 45 to a selected one of an array of second voltage dividers, which are referred to as horizontal voltage dividers since the voltage at horizontal output point 14 is provided through this array. The particular horizontal voltage divider selected depends upon the desired operating mode of the tester.

The first secondary lead 36 in the embodiment shown is provided at a 4.5 VAC tap point along secondary winding 26. First secondary lead 36 includes selectable connections 60 and 64, which, when activated, couple first secondary lead 64 to (1) a resistor 62 which in the embodiment shown is 18 Kohms and is connected to ground, and (2) a first selected one of an array of third voltage dividers, which are referred to as vertical voltage dividers because the voltage at vertical output point 16 is provided through this array.

Second secondary lead 38 is provided at a 6 VAC tap point along secondary winding 26, and includes selective connection 66, which, when activated, couples second secondary lead 38 to a resistance 68 which is connected to ground, which in the embodiment shown, is approximately 10 ohms.

Third secondary lead 40 is provided at a 20 VAC tap point along secondary winding 26 and includes selectable connections 70 and 74, which, when activated, couple third secondary lead 40 to (1) a resistance 72 which, in the embodiment shown, is 18 Kohms and is connected to ground, and (2) a second vertical voltage divider.

Fourth secondary lead 42 is provided at a 40 VAC tap point, at the upper end of secondary winding 26, and includes selective connections 76 and 80, which, when activated, couple fourth secondary lead 42 to (1) a resistance 78 which, in the embodiment shown, is 18 Kohms and is connected to ground, and (2) a third vertical voltage divider.

In the embodiment shown, the array of horizontal voltage dividers includes first, second and third horizontal voltage dividers, while the array of vertical voltage dividers includes first, second and third vertical voltage dividers. These voltage divider arrays are selected and arranged so that a specified nominal voltage level is provided at horizontal and vertical inputs 18, regardless of the mode in which the tester is operating. Hence, testing circuit 10 is matched to a partial oscilloscope to provide best results. In the embodiment shown, the voltage level is 3/10th VAC (nominal).

In the low voltage, low impedance mode, selective connections 54, 60, 64 and 66 are activated. Selective connection 54 couples circuit line 52 to the first horizontal voltage divider, comprising in the embodiment shown a series connection of a resistance 82 and a resistance 83 to ground. In the embodiment shown, resistance 82 is 47 Kohms and resistance 83 is 330 Kohms. The signal developed at circuit point 84 intermediate resistances 82 and 83 is applied as one signal output to horizontal output point 14.

Selective connection 64 couples first secondary lead 36 to the first vertical voltage divider, which comprises a series connection of resistances 85 and 86 to ground. In the embodiment shown, resistance 85 is 100 Kohms and resistance 86 is 330 Kohms. The signal developed at circuit point 87 intermediate resistances 85 and 86 is applied as the other signal output to vertical output point 16.

When testing circuit 10 is in the low voltage, low impedance mode, third and fourth secondary leads 40 and 42 are open, because selective connections 56, 58, 70, 74, 76 and 78 are all open, due to the operation of lock-out switch 89, which is set by the operator from the front panel of the tester.

When testing circuit 10 is in its low voltage, low impedance mode, it is particularly useful in determining the operating state of single semiconductor junctions, while they remain connected in circuit, even low impedance circuits.

In the medium voltage, medium impedance mode, selective connections 56, 70 and 74 are activated by lock-out switch 89. Selective connection 56 couples circuit line 52 to a second horizontal voltage divider comprising a series connection of resistances 88 and 83. Resistance 88 in the embodiment shown is 100 Kohms, and is common to resistance 82 at circuit point 84.

Selective connection 74 couples third secondary lead 40 to a second vertical voltage divider comprising a series connection of resistances 90 and 86. Resistance 90 in the embodiment shown in 470 Kohms, and is common to resistance 86 at circuit point 87.

In the medium voltage, medium impedance mode, the first, second and fourth secondary leads are open, because selective connections 54, 58, 60, 64, 66, 76 and 80 are all open, due to the action of lock-out switch 89.

When testing circuit 10 is in its high voltage, high impedance mode, selective connections 58, 76 and 80 are activated by lock-out switch 89. Connection 58 couples circuit line 52 to a third horizontal voltage divider comprising a series connection of resistances 92 and 83. Resistance 92 is 330 Kohms in the embodiment shown, and is common to resistances 82 and 88 at circuit point 84.

Selective connection 80 couples fourth secondary lead 42 to a third vertical voltage divider comprising a series connection of resistances 94 and 86. Resistance 94 is 1 Megohm in the embodiment shown, and is common to resistances 90 and 85.

In the high voltage, high impedance mode, the first, second and third secondary leads are open, because selective connections 54, 56, 60, 64, 66, 70 and 74 are open, again due to the action of lock-out switch 89.

The medium and high modes of the tester are particularly suitable for checking high voltage and/or multiple junctions at very low current levels.

The signal outputs of testing circuit 10 present at horizontal and vertical output points 14 and 16 are applied to the horizontal and vertical inputs 18 and 20 of display circuit 12.

Display circuit 12 includes a standard cathode ray tube (CRT) 100 with its associated conventional deflection and control circuits 112 and 120, respectively. A power supply 102, comprising a transformer and related circuitry, provides voltage outputs of −800 volts, and +300 volts for operation of display circuit 12.

The signals present at horizontal and vertical inputs 18 and 20 are each 3/10ths VAC, as explained above, which produces the best results in display circuit 12. The signals are applied to amplifiers 104 and 106, which amplify them to the required level necessary to achieve the desired trace size on the fact of CRT 100. Amplifiers 104 and 106 both contain a calibration (not shown) comprising a variable resistance connected to ground, which is set at the factory to match the output of amplifiers 104 and 106 to the operating characteristics of them associated CRT.

The output of amplifier 104, which contains the horizontal trace information, is applied over circuit line 108 directly to one of the horizontal deflection plates (not shown) in CRT 100, and is also applied simultaneously over circuit line 110 to deflection circuit 112, which produces a stable reference voltage for application to the other horizontal deflection plate (not shown) over circuit line 113.

Likewise, the output amplifier 106, which contains the vertical trace information, is applied over circuit line 114 to one of the vertical deflection plates (not shown) in CRT 100, and is also applied simultaneously over circuit line 116 to deflection circuit 112, which produces a stable reference voltage for application on circuit line 118 to the other vertical deflection plate (not shown) in CRT 100.

The generation of the electron beam in the CRT, as well as the control over the focus, astigmatism and brightness of the beam trace, is achieved by control circuit 120.

The beam produced in the CRT under the control of control circuit 120 is deflected and shaped by the voltage on the deflection plates, which, as explained above, is provided by deflection circuit 112 and amplifiers 104 and 106. The trace on the face of CRT produced by the shaped beam must then be interpreted by the operator to obtain the operating condition of the semiconductor junction or junctions under test.

Figure 2:
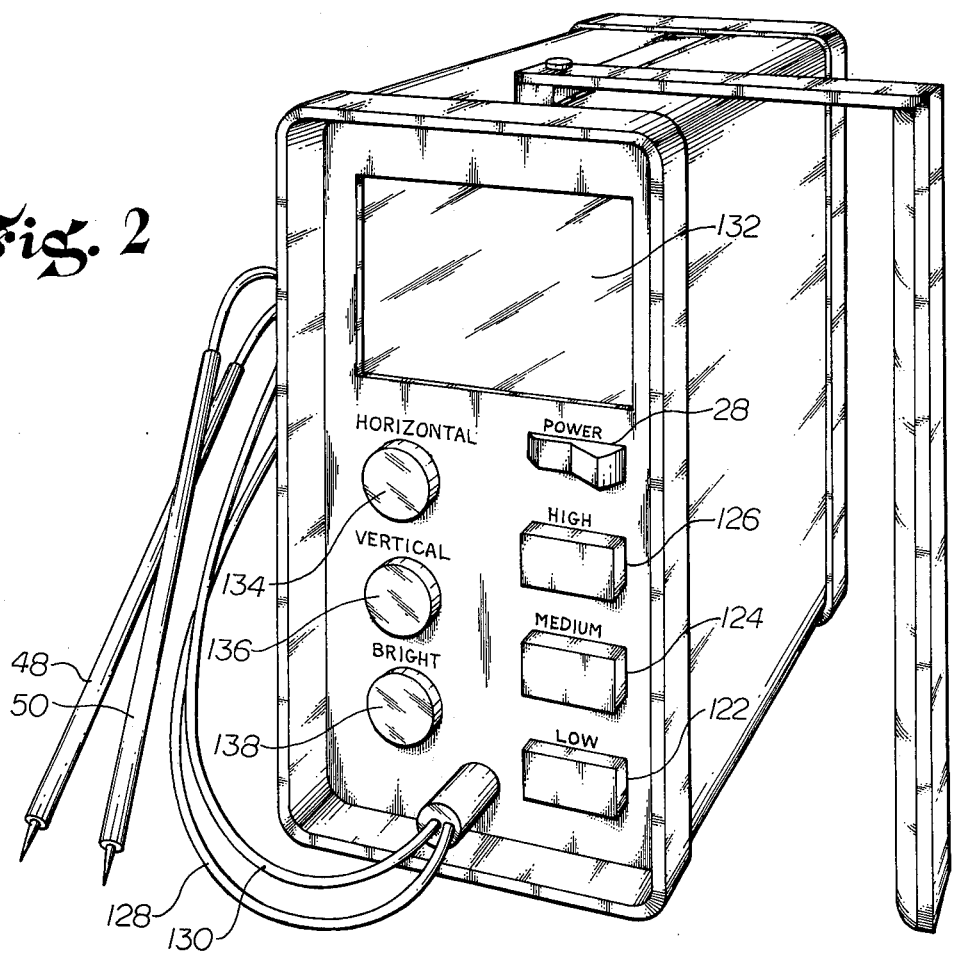
FIG. 2 is an isometric view of the tester of the present invention, showing in particular the arrangement of the controls on the front panel of the tester, the visual indicator, and the tester probes.

Referring now to FIG. 2, the apparatus of the present invention is shown in the form of commercial embodiment. In the present invention, the visual indicator, in the form of an oscilloscope, is provided in integral combination with the testing circuit to form a unitary, portable, and convenient to use instrument.

Power to the instrument is controlled, as stated above, by on/off switch 28, which is connected in the primary of the testing circuit transformer. The operating mode of testing circuit 10 is selected by the operator through actuation of one of three mode buttons 122, 124 and 126. Mode buttons 122, 124 and 126 operate lock-out switch 89, resulting in activation of the correct selective connections for the particular mode selected, and de-activation of the other selective connections.

Probes 48 and 50 are connected through lead lines 128 and 130 to testing circuit 10 in the apparatus in the manner shown in FIG. 1. When probes 48 and 50 are positioned such that a semiconductor junction or junctions are electrically connected therebetween, electrical signals are produced at horizontal and vertical circuit points 14 and 16. The magnitude of the signals are dependent on the forward and reverse characteristics of the junction or junctions under test. The signals are applied to horizontal and vertical input connections 18 and 20 of display circuit 12, and result in a visible trace on the face 132 of CRT 100. The operator, by inspection, can then determine the operating state of both the forward and reverse directions of the junction or junctions under test.

Certain characteristics of the trace are adjustable by the operator directly from controls located on the front panel of the tester. The horizontal and vertical positions of the trace are adjusted through controls 134 and 136, which adjust the value of variable resistances (not shown) in deflection circuit 112. The brightness of the trace may be adjusted by the operator through control 138, which adjusts the value of a variable resistance (not shown) in control circuit 120.

In operation, the apparatus of the present invention has three operating modes, each mode corresponding to a different testing circuit arrangement and adapted to be use in different testing circumstances. The medium and high voltage and impedance modes, in particular, differ substantially in arrangement and application from the low voltage, low impedance mode.

In the low-voltage, low impedance mode, i.e., when selective connection 54, 60, 64 and 66 are activated, with first and second secondary leads 36 and 38 thus operating, testing circuit 10 presents a very low, i.e., about 10 ohms, output impedance and a low voltage, i.e., about 1 VAC, to the junction under test and the circuit in which it is connected. This arrangement results in a maximum text current of approximately 100 ma.

The voltage presented by testing circuit 10 in the low mode is sufficiently large to fire a single semiconductor junction in circuit, without damage to either the junction or the circuit, because of the low current level.

The low impedance, which is usually substantially lower than the effective impedance of the circuit in which the junction is connected, permits the junction to be tested accurately and completely in circuit.

Figure 3A:
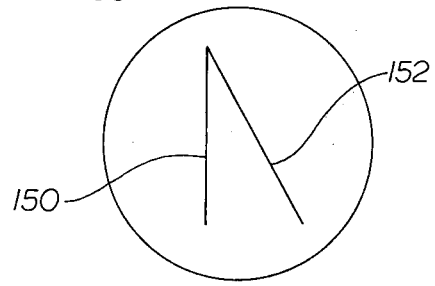
FIG. 3a is an oscilloscope pattern produced by the circuit of FIG. 2 in its low impedance mode when the semiconductor junction under test is good.

The trace produced on the face 132 of the CRT 100, when the tester is in its low voltage, low impedance mode and a single junction is being tested, will have two portions, such as shown in FIG. 3a. A first portion 150, which in the case of a good junction will be a straight vertical line, is a product of the signals at horizontal and vertical inputs 18 and 20, generated during the half-cycle of the testing signal applied to the junction which is coincident with the forward direction of the junction. Over this half-cycle, there will be a virtual short circuit between probes 48 and 50, and hence, no horizontal signal is present at horizontal input 18 and a straight vertical line results on CRT 100. If this portion of the trace is other than a straight vertical line, then the operator knows that the junction is bad.

Over the other half cycle of the testing signal applied to the junction, the reverse direction of the junction is effectively between probes 48 and 50, along with the effective impedance of the circuit in which the junction is connected, which in a typical case is approximately 1-2 Kohms.

Hence, over the other half cycle of the testing signal a substantial value of impedance is presented between probes 48 and 50, and a horizontal signal is present at horizontal input 18, for application to the horizontal deflection plates of CRT 100. A second portion 152 of the trace is produced during the other half-cycle of the testing signal, since signals are present at both the horizontal and vertical inputs 18 and 20. The angle of portion 152 depends upon the value of the effective impedance between probes 48 and 50 in the reverse direction of the junction being tested. Portion 152 connects at one end with one end of the first portion 150, as shown in FIG. 3a.

Figure 3B:
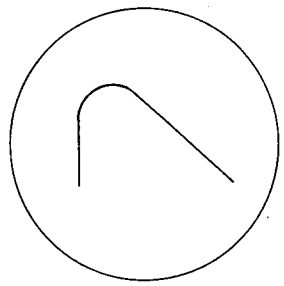
FIG. 3b is an oscilloscope pattern produced in the low impedance mode when the semiconductor junction under test is leaking.

The combined trace, comprising first and second portions 150 and 152, shows both the forward and reverse characteristics of the junction. A faulty junction condition, e.g. open, shorted or leaking, can be easily ascertained by an inspection of the trace, since a faulty junction substantially affects the configuration of the trace. A leaking transistor, for instance, will result in a trace similar to that shown in FIG. 3b, where the trace is curved or rounded, rather than sharp, where portions 150 and 152 meet, due to partial breakdown of the junction so that it acts like a resistance, rather than a barrier.

The low voltage, low impedance mode is not suitable, however, for testing multiple or cascaded junctions or single junctions requiring a relatively high firing voltage. In those applications, either the medium voltage, medium impedance, or the high voltage, high impedance modes are used, depending upon the value of voltage needed to fire the actual junction or junctions to be tested.

In the medium and high modes, the output impedance of testing circuit 10 is increased to the point where the test current is extremely low. This permits special purpose tests to be made, such as, for instance, completely checking the emitter-collector junction of a power transistor.

In the medium mode, the impedance presented by testing circuit 10 to the junction(s) under test is approximately 18 Kohms with an output voltage of approximately 20 VAC, while in the high mode, the output impedance is approximately 27 Kohms, with an output voltage of approximately 40 VAC. In the medium and high modes, the output current is effectively limited to approximately 0.5 ma by the combination of primary resistor 30, and the arrangement of testing circuit 10 in those modes.

In the medium and high modes of the present invention, it is possible to make junction tests not heretofore possible.

One such test, mentioned above, is a check of the back-to-back emitter-to-collector junctions of a transistor. When probes 48 and 50 are placed on the emitter and collector of a transistor, the operating state of both junctions are clearly shown, even though one junction is in its forward direction, and the other junction is in its reverse direction, provided that the testing circuit is in the mode which produces the necessary value of firing voltage. Although the magnitude of the voltage provided by testing circuit 10 is high enough to fire both junctions, the current level is so low that the test does no harm to either junction. Hence, emitter-to-collector forward and reverse characteristics of a given transistor may be accurately and completely checked in a convenient, fast, one-step operation.

The emitter-to-collector test is particularly useful in checking transistors, particularly power transistors, prior to their use in a circuit, especially in those instances where the transistor might otherwise appear to be good but breaks down toward the upper end of its normal operating voltage range. Such a condition can not be ascertained by conventional instruments, but can readily be determined by the present invention operating in its medium and high modes.

When the tester is in its medium or high modes, the trace produced on the face 132 of CRT 100 will be somewhat different over one portion of the trace than that produced when the tester is in its low mode. When the junction or junctions being tested are good, there will be virtually no impedance between probes 48 and 50 over one-half of the testing signal, and hence no signal present at horizontal input 18. A first trace portion 160 (FIG. 4a) which is a straight vertical line, results. Portion 160 is hence identical to portion 150 of FIG. 3a.

Figure 4A:
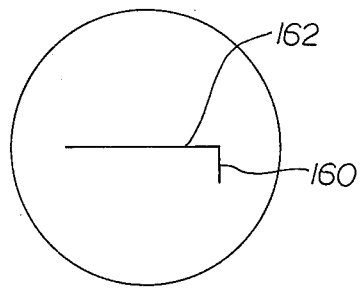
FIG. 4a is an oscilloscope pattern produced in the medium or high impedance modes when the junction under test is good.

However, in the reverse direction where an impedance is presented between probes 48 and 50, the relatively high output impedance of testing circuit 10 in the medium and high modes will prevent any voltage from being present at vertical input 20, and hence, over the other half-cycle of the testing signal, a straight horizontal line is produced in CRT 100, e.g. portion 162 in FIG. 4a.

Hence, in the medium and high voltage modes, a good junction or junctions will produce a trace comprising a straight horizontal line and a straight vertical line. In testing multiple junctions, such as emitter-to-collector, vertical portion 160 joins horizontal portion 162 at one side thereof, as shown in FIG. 4a.

Figure 4B:
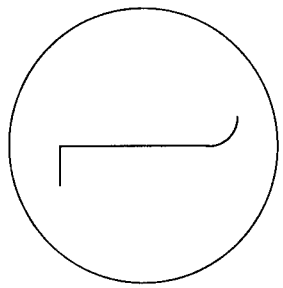
FIG. 4b is an oscilloscope pattern generated in the medium and high impedance modes when the junction under test is leaking.

When one or both junctions in an emitter-to-collector test are faulty, the configuration of the trace will change accordingly. When the fault is a breakdown of the junction toward the upper end of its normal operating voltage range, the horizontal portion 162 of the trace will begin to curve, as shown in FIG. 4b, when it begins to break down.

In the medium and high modes, however, a substantial testing circuit impedance is necessary to limit the test current to a level which is not harmful to the junctions under test. The relatively high impedance of testing circuit 10 in its medium and high modes (compared to its low mode) somewhat limits the use of the tester to check junctions in-circuit in those modes. In the medium mode, testing junctions in-circuit is usually accurate down to an effective circuit impedance of approximately 600 ohms, while in the high mode, testing is accurate down to an effective circuit impedance of approximately 1500 ohms. When the junction is out-of-circuit, however, there are no such limits on the use of the tester.

Hence, in operation of the tester in any one of its low, medium and high modes, a CRT trace indicative of the forward and reverse characteristics of a junction or junctions under test is produced for visual inspection by an operator. The three operating modes of the test correspond to three different testing circuit arrangements which operate from a single step-down transformer, and permit accurate, complete, and safe testing of a wide variety of semiconductor junctions, including single and multiple junctions, high voltage transistor junctions, power transistor junctions, and even back-to-back junctions.

It has also been found, however, that the tester is capable of checking devices other than semiconductor junctions. The condition of electrolytic capacitors, for instance, can be accurately checked in the tester's low-voltage, low-impedance mode. When an electrolytic capacitor in good operating condition is connected between probes 48 and 50, a somewhat ellipitical trace is produced on CRT 100, due to the normal charging and discharging action across the capacitor. If the capacitor is either shorted or open, however, the trace produced is a straight vertical line or a straight diagonal line, respectively, thereby providing an immediate indication that the capacitor is bad, and thus must be replaced.

Hence, although the present invention is primarily useful in checking semiconductor junctions, its capability of displaying the effect of both cycles of an alternating current applied across a device makes it useful in other situations. It thus should be understood that the invention is not limited to the testing of semiconductor junctions per se.

Although a preferred embodiment of the invention has been disclosed herein for purposes of illustration, it should be understood that various changes, modifications, and substitutions may be incorporated in such embodiment without department from the spirit of the invention, which is defined by the claims which follow.

What is claimed is:

1. An improved semiconductor junction tester, comprising:
   a. visual indicator means having two input connections;
   b. signal generating means having first, second and third output lines, and producing a first known AC voltage between said first and second output lines, and producing a second known AC voltage between said first and third output lines, at least the AC voltage provided between said first and second output lines being variable;
   c. first impedance means connected between the first output line of said signal generating means and ground;
   d. means adapted to be connected across a junction to be tested, said adapted means in turn being connected to the tester in such a manner that said junction is in parallel electrically with said first impedance means and such that, in tester operation, an AC test signal is provided across said junction;
   e. second impedance means connectable between the second output line of said signal generating means and ground, such that said second impedance means, when so connected, is in parallel electrically with said first impedance means;
   f. third impedance means connectable between the third output line of said signal generating means and ground, such that said third impedance means, when so connected, is in parallel electrically with said first impedance means; and
   g. means for selectively connecting and disconnecting said third impedance means to the third output line of said signal generating means, wherein, in operation of the tester, a first output signal is developed between said first impedance means and ground for application to one input connection of said indicator means and a second signal output is developed between said second impedance means and ground for application to the other input connection of said indicator means, and wherein said signal generating means is so configured and arranged, and has such an impedance between its first, second and third output lines, and wherein said second and third impedances have such values that (1) in a first operating condition of the tester, wherein said third impedance means is connected, and the AC voltage between the first and second output lines is at a level which is less than the AC voltage between the first and third output lines, an impedance is presented to said junction which is substantially lower than the effective impedance of the circuit in which said junction is connected, and (2) in a second operating condition of the tester, wherein said third impedance means is disconnected, the amplitude of the voltage between the first and second output lines may be increased to a level sufficient to fire said junction and sufficient impedance is presented to said junction to limit the current therethrough to a safe level, whereby a pattern is produced on said visual indicator means which is indicative of the forward and reverse characteristics of said junction.

2. An apparatus of claim 1, including first and second voltage divider means, wherein said first voltage divider means is connected between said first impedance means and ground for establishing a nominal voltage level for said first signal, and wherein said second voltage divider means is connected between said second impedance means and ground for establishing a nominal voltage level for said second signal.

3. An apparatus of claim 2, said first and second voltage divider means comprise impedances which are variable in value, corresponding to the operating condition of the tester.

4. An apparatus of claim 3, wherein said third impedance is approximately 10 ohms.

5. An apparatus of claim 3, wherein the AC voltage between the first and third output lines of said signal generating means is approximately 6 VAC, and wherein the AC voltage between the first and second output lines of said signal generating means may be at selected levels between 4.5 VAC and 40 VAC.

6. An apparatus of claim 3, wherein said visual indicator means is an oscilloscope having horizontal and vertical input connections.

7. An improved semiconductor junction tester, comprising:
   a. visual indicator means having horizontal and vertical input connections;
   b. transformer means having a primary winding and a secondary winding, said secondary winding including a common lead and a plurality of secondary leads, including in succession, first, second and third secondary leads and a fourth secondary lead located between said first and second secondary leads;
   c. common impedance means connected between said common lead and ground for developing a first signal for application to the horizontal input connection of said indicator means;
   d. means adapted to be connected across a junction to be tested, said adapted means in turn being connected to the tester in such a manner that said junction is in parallel electrically with said common impedance means, and such that an AC test signal is provided across said junction;
   e. first, second and third impedance means selectively connectable, respectively, between said first, second and third secondary leads and ground for the purpose of developing a second signal for application to the vertical input connection of said indicator means, wherein said first, second and third impedance means, when so connected, are in parallel electrically with said common impedance means;
   f. fourth impedance means selectively connectable between said fourth secondary lead and ground, said fourth impedance means, when so connected, being in parallel electrically with said common impedance means, wherein said common impedance means has a substantially larger value then said first, second and third impedance means, and wherein said fourth impedance means is substantially smaller in value than said first, second and third impedance means and further is substantially smaller in value than the effective impedance of the circuit in which the junction to be tested is connected; and
   g. switching means having three operable positions, such that the tester has at least three operating modes, wherein said first and fourth impedance means are connected respectively, to said first and fourth secondary leads when said switching means is in a first position, wherein said second impedance means is connected to said second secondary lead when said switching means is in a second position, and wherein said third impedance means is connected to said third secondary lead when said switching means is in a third position, wherein said tester in operation presents a relatively low voltage and low impedance to the junction under test when said switching means is in said first position, wherein said tester presents a substantially higher voltage and impedance to the junction under test when said switching means is in said second position, and further wherein said tester presents an even higher voltage and impedance to said junction under test when said switching means is in said third position, said common impedance means and said first, second, third and fourth impedance means being selected and arranged so as to limit the current presented to the junction under test to a safe level.

8. An apparatus of claim 7, including first and second voltage divider means, wherein said first voltage divider means is connected between said common impedance means and ground for establishing a nominal voltage level for said first signal; and wherein said second voltage divider means is selectively connectable between said first, second and third impedance means and ground for establishing a nominal voltage level for said second signal.

9. An apparatus of claim 8, wherein said first and second voltage divider means comprise impedances which are variable in value, corresponding to the operating mode of the tester.

10. An apparatus of claim 9, wherein said primary winding includes a fifth resistance means which assists in limiting the current applied to the junction under test.

11. An apparatus of claim 9, wherein said common impedance means comprises a third voltage divider which in turn comprises two impedances of substantially equal value.

12. An apparatus of claim 9, wherein said first secondary lead provides approximately 4.5 VAC, wherein said secondary lead provides approximately 20 VAC, wherein said third secondary lead provides approximately 40 VAC, and wherein said fourth secondary lead provides approximately 6 VAC.

13. An apparatus of claim 12, wherein said first, second and third impedance means are substantially equal in value.

14. An apparatus of claim 13, wherein said fourth impedance means is approximately 10 ohms.

15. An apparatus of claim 14, wherein said first, second and third impedance means are approximately 18 Kohms, and wherein the two impedances comprising said third voltage divider means are 100 Kohms each.

* * * * *